US006566962B2

(12) United States Patent
Luo

(10) Patent No.: US 6,566,962 B2
(45) Date of Patent: May 20, 2003

(54) APPARATUS AND METHOD FOR TUNING AN INTER-STAGE MATCHING NETWORK OF AN INTEGRATED MULTISTAGE AMPLIFIER

(75) Inventor: Sifen Luo, Hartsdale, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 2 days.

(21) Appl. No.: 09/846,860

(22) Filed: May 1, 2001

(65) Prior Publication Data
US 2002/0163388 A1 Nov. 7, 2002

(51) Int. Cl.[7] .............................................. H03F 3/191
(52) U.S. Cl. ....................................... 330/305; 330/310
(58) Field of Search ............................ 330/66, 67, 150, 330/302, 305, 310

(56) References Cited
U.S. PATENT DOCUMENTS 5,276,406 A * 1/1994 Samay et al. ................ 330/302
5,412,347 A * 5/1995 Minnis ........................ 330/286
5,745,857 A * 4/1998 Maeng et al. ................ 330/310
6,236,266 B1 * 5/2001 Choumei et al. ........... 330/310

* cited by examiner

Primary Examiner—Robert Pascal
Assistant Examiner—Khanh Van Nguyen

(57) ABSTRACT

A tuning circuit for compensating an inter-stage matching network included in an integrated multistage radio frequency (RF) amplifier includes one or more capacitors connected in shunt between ground and a voltage supply to the amplifier. The capacitors have values selected to effectively compensate the inductance from a pull-up inductor included in the inter-stage matching network to provide improved inter-stage matching when inductance and capacitance values of the inter-stage matching network deviate from their desired values due to parasitics and/or when other components, such as input-stage and output-stage transistors of the amplifiers deviate from their pre-fabrication simulation models.

18 Claims, 4 Drawing Sheets

APPARATUS AND METHOD FOR TUNING AN INTER-STAGE MATCHING NETWORK OF AN INTEGRATED MULTISTAGE AMPLIFIER

TECHNICAL FIELD OF THE INVENTION

The present invention relates generally to multistage amplifier circuits, and in particular, to a technique for tuning an inter-stage matching network included in a multistage amplifier.

BACKGROUND OF THE INVENTION

Network matching is an important part of radio frequency (RF) circuit design. With multistage RF amplifiers, i.e., amplification circuits having more than one amplifier cascaded together, it is typically necessary to provide both input matching networks and output matching networks, as well as inter-stage matching networks between the amplifiers included in the multistage circuit.

Input and output matching of a multistage RF amplifier can be generally done using conventional source-pull and load-pull techniques. In many cases, input and output matching can be readily accomplished using off-circuit (i.e., non-integrated) discrete components connected to a printed circuit board (PCB).

However, with multistage amplifiers implemented as single integrated circuits (ICs), the inter-stage matching can be difficult due to limited access to the inter-stage matching networks and manufacturing deviations in their component values.

A commonly used inter-stage matching network for integrated circuit RF power amplifiers consists of a high-pass inductor capacitor (LC) section, i.e., a series-connected capacitor and a shunt-connected inductor that is also used as a pull-up inductor connected to a direct current (DC) voltage supply for the circuit. The high-pass LC section is usually fabricated as part of the RF amplifier integrated circuit (IC). The values of components on the IC cannot be changed or are difficult to change once the IC is fabricated.

The performance of a fabricated inter-stage matching network may deviate from its simulated design because pre-fabrication simulation models of on-chip components in an IC are not always completely accurate. Furthermore, the simulation models of the on-chip RF components are often developed using small basic cells. This can cause discrepancies between simulated and measured results when many basic cells are put together to form a larger IC or component. These are common phenomen in RF circuit design, in general, and RF power amplifier design, in particular.

In an inter-stage matching network, small deviations of the inductance and capacitance values from desired values often result in mismatching. Such mismatching can significantly degrade the performance of a multistage amplifier. Specifically, the power-added efficiency (PAE), gain and output power of the multistage amplifier are dependant on the inductance and capacitance of the inter-stage matching network. Accordingly, the PAE, gain and output power can decrease significantly with minor deviations in the inductance and the capacitance of an inter-stage matching network.

There is thus a need for an improved method and apparatus for tuning an inter-stage matching network of an integrated multistage amplifier to boost amplifier performance.

SUMMARY OF THE INVENTION

In view of the foregoing, the present invention provides a circuit topology for tuning an inter-stage matching network included in an integrated multistage RF amplifier. An advantage of the invention is that it significantly improves the performance of multistage RF power amplifiers (PAs), particularly those used for wireless applications.

According to one embodiment of the invention, a tuning circuit includes one or more off-chip capacitors connected in shunt between ground and the voltage supply of a first stage of an integrated multistage amplifier. The capacitors can have values selected to effectively tune or compensate the inductance from a pull-up inductor included in an inter-stage matching network to provide improved inter-stage matching when inductance and capacitance values of the inter-stage matching network deviate from their desired values due to parasitics and/or when other components, such as input-stage and output-stage transistors of the amplifiers deviate from their pre-fabrication simulation models.

The foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENTS

Figure 1:
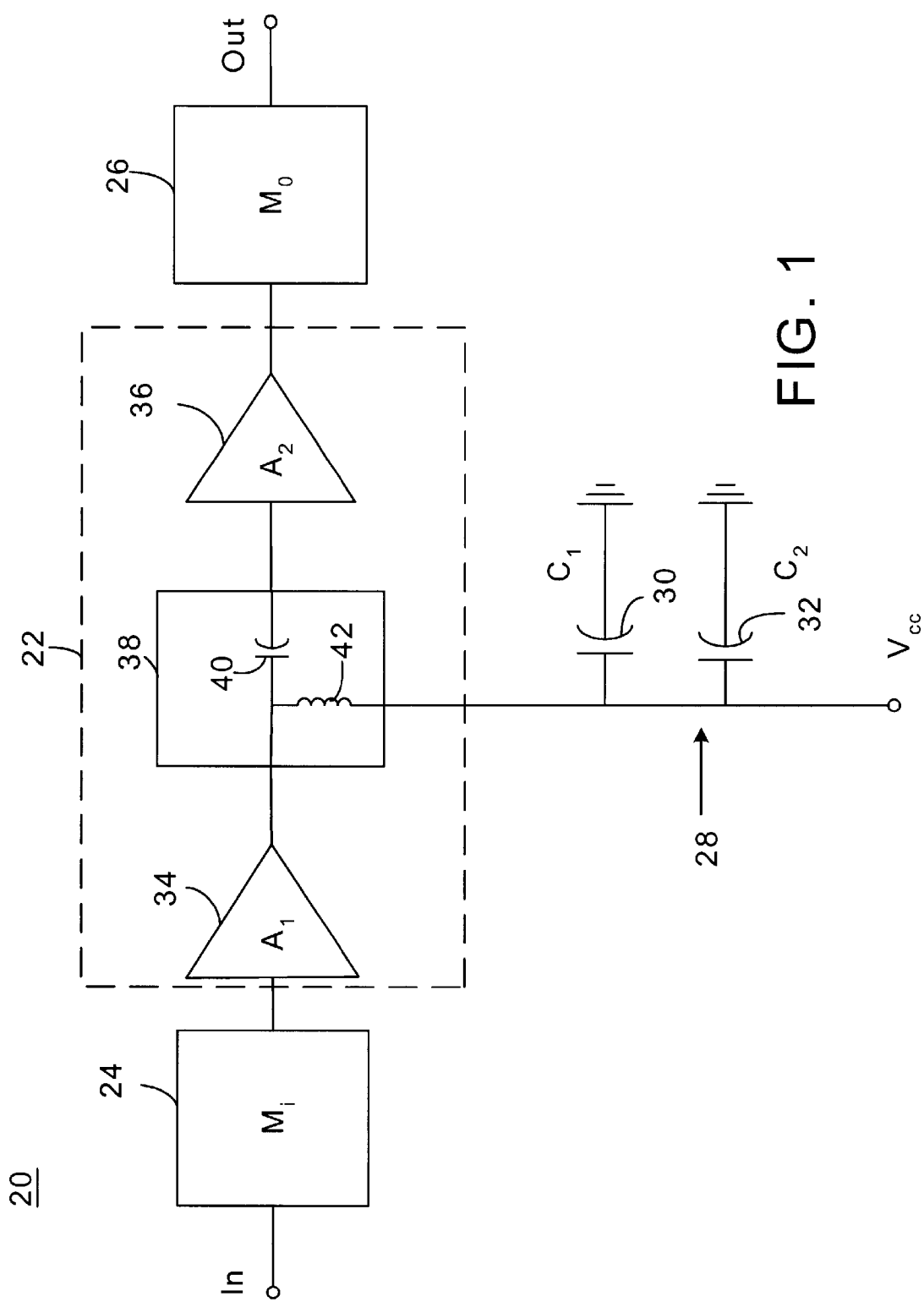
FIG. 1 is a schematic diagram of an exemplary multistage amplifier circuit in accordance with an embodiment of the present invention.

Turning now to the drawings, and in particular to FIG. 1, there is illustrated a multistage amplifier circuit 20 in accordance with one embodiment of the present invention. The amplifier circuit 20 includes an input matching network Mi 24, a multistage amplifier integrated circuit (IC) 22, an output matching network Mo 26, and a tuning circuit 28. The multistage amplifier 22 includes a first stage amplifier A1 34, a second stage amplifier A2 36, and an inter-stage matching network Mis 38. The inter-stage matching network 38 includes a high-pass LC section having an inductor 42 and a capacitor 40.

The tuning circuit 28 includes a first capacitor C1 30 and a second capacitor C2 32, both connected between the supply voltage Vcc and ground. The capacitors 30, 32 can have values selected to effectively tune or compensate the inductance from the pull-up inductor 42 included in the inter-stage matching network 38 to provide improved inter-stage matching when inductance and capacitance values of the inter-stage matching network 38 deviate from their desired values due to parasitics and/or when other components, such as input-stage and output-stage transistors of the amplifiers deviate from their pre-fabrication simulation models.

The capacitors 30,32 are preferably off-chip discrete surface mount capacitors. Alternatively, the capacitors 30,32 can be open-circuit transmission lines having specified widths and lengths to provide the desired operational capacitance values, or a combination of open-circuit transmission lines and discrete capacitors.

Although the exemplary circuit 20 of FIG. 1 shows the pair of shunt capacitors 30, 32, the tuning circuit 28 can be realized using a single capacitor, multiple capacitors, or a combination of capacitors with resistors and/or inductors, as long as they do not form a DC path to the ground. In addition, the multistage amplifier 22 can have two or more stages, and in multistage circuits having three or more amplifier stages, multiple tuning circuits can be respectively connected to the voltage supplies of each stage but the last.

Figure 2:
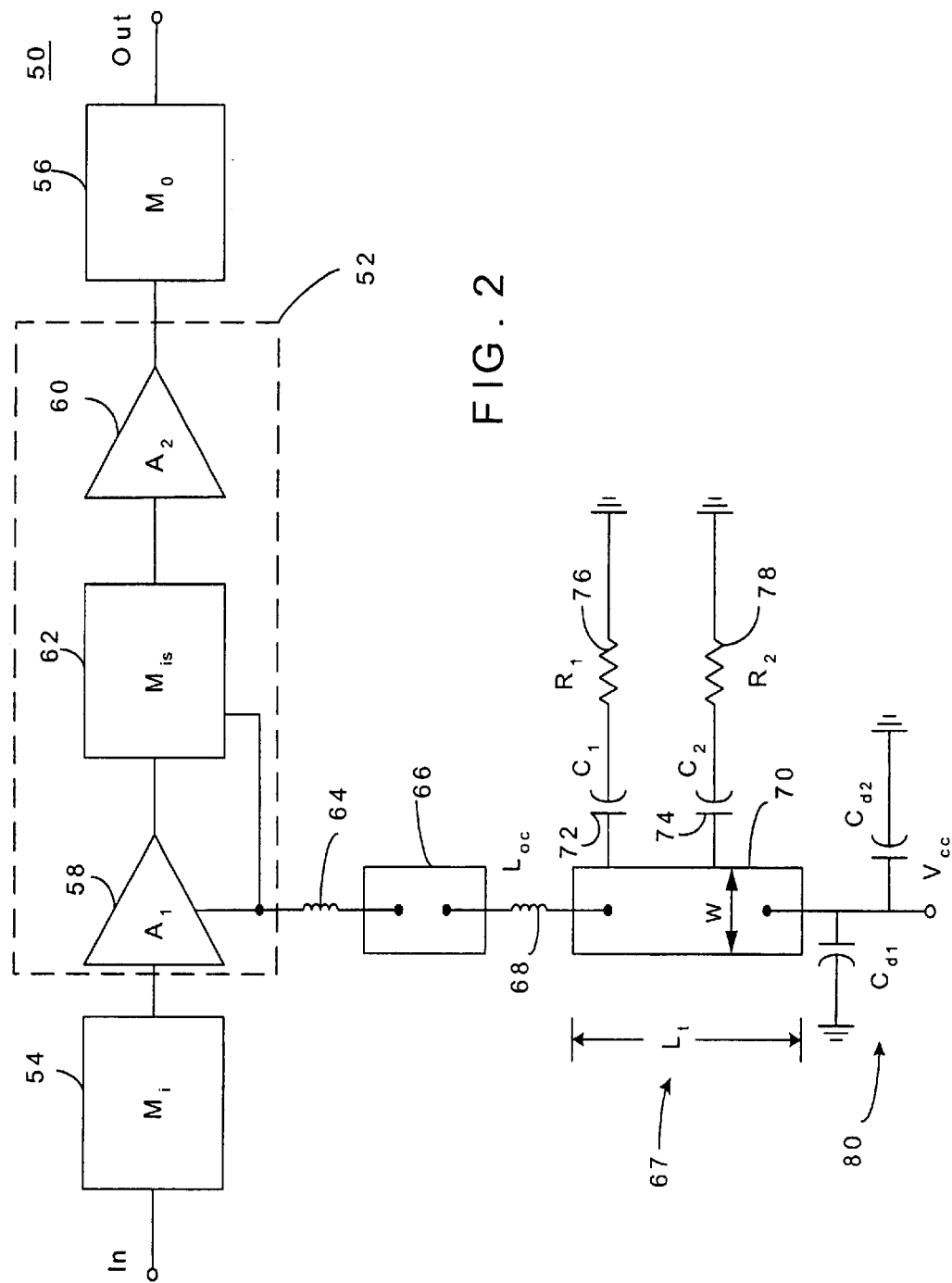
FIG. 2 is a schematic diagram of an exemplary multistage amplifier circuit in accordance with another embodiment of the present invention.

FIG. 2 is a schematic diagram of a multistage amplifier circuit 50 in accordance with another embodiment of the present invention. The amplifier circuit 50 includes an input matching network $M_i$ 54, an output matching network $M_o$ 56, a multistage amplifier IC 52, and a tuning circuit 67. The multistage amplifier 52 includes a first stage amplifier $A_1$ 58, a second stage amplifier $A_2$ 60, and an inter-stage matching network $M_{is}$ 62. The inter-stage matching network $M_{is}$ 62 can include a high-pass LC section, as shown in FIG. 1.

The tuning circuit 67 includes a printed circuit board (PCB) trace 70, a first capacitor-resistor pair 72, 76 and second capacitor-resistor pair 74, 78. The PCB trace 70 has a predetermined length $L_t$ and width W. The resistors $R_1$ 76 and $R_2$ 78 connected in series with the tuning capacitors $C_1$ 72 and $C_2$ 74, respectively, can be used to reduce the Q of the capacitors.

The multistage amplifier IC 52 is connected to an external pad 66 by a bonding wire 64. An off-chip inductor $L_{oc}$ 68 connects the pad 66 to the PCB trace 70 to supply power to the first stage 58 of the amplifier IC 52.

A pair of de-coupling capacitors $C_{d1}$, $C_{d2}$ 80 are connected in shunt between the voltage source $V_{cc}$ and ground.

FIG. 2 illustrates a connection from a power supply $V_{cc}$ through the PCB trace 70 to a supply terminal of the amplifier IC 52. The PCB trace 70 can be treated as a transmission line of length $L_t$ and width W. Shown in FIG. 2 are two de-coupling capacitors $C_{d1}$, $C_{d2}$ 80 and the off-chip pull-up inductor $L_{oc}$ 68. If $L_{oc}$ 68 is not used, its value can be set to zero. In this case, the pad 66 and trace 70 can be combined into a single trace.

Depending on the length and width of the trace 70, the impedance of the trace presented at $L_{oc}$ 68 can be high or low. When the impedance is very low, the tuning capacitor-resistor pairs $C_1$, $R_1$ 72, 76 and $C_2$, $R_2$ 74, 78 have little effect on the inter-stage matching. However, the impedance values of $C_1$, $R_1$ and $C_2$, $R_2$ can significantly affect the inter-stage matching when the impedance at $L_{oc}$ 68 is higher compared to that of $C_1$, $R_1$ and $C_2$, $R_2$. This is because the combined impedance of the resistor and capacitor in each tuning pair, $C_1$, $R_1$ and $C_2$, $R_2$, provides an effective low-impedance path for the bonding wire 64 and the off-chip inductor Loc 68 and effectively tunes the total value of the inductance in the inter-stage matching network 62.

Figure 3:
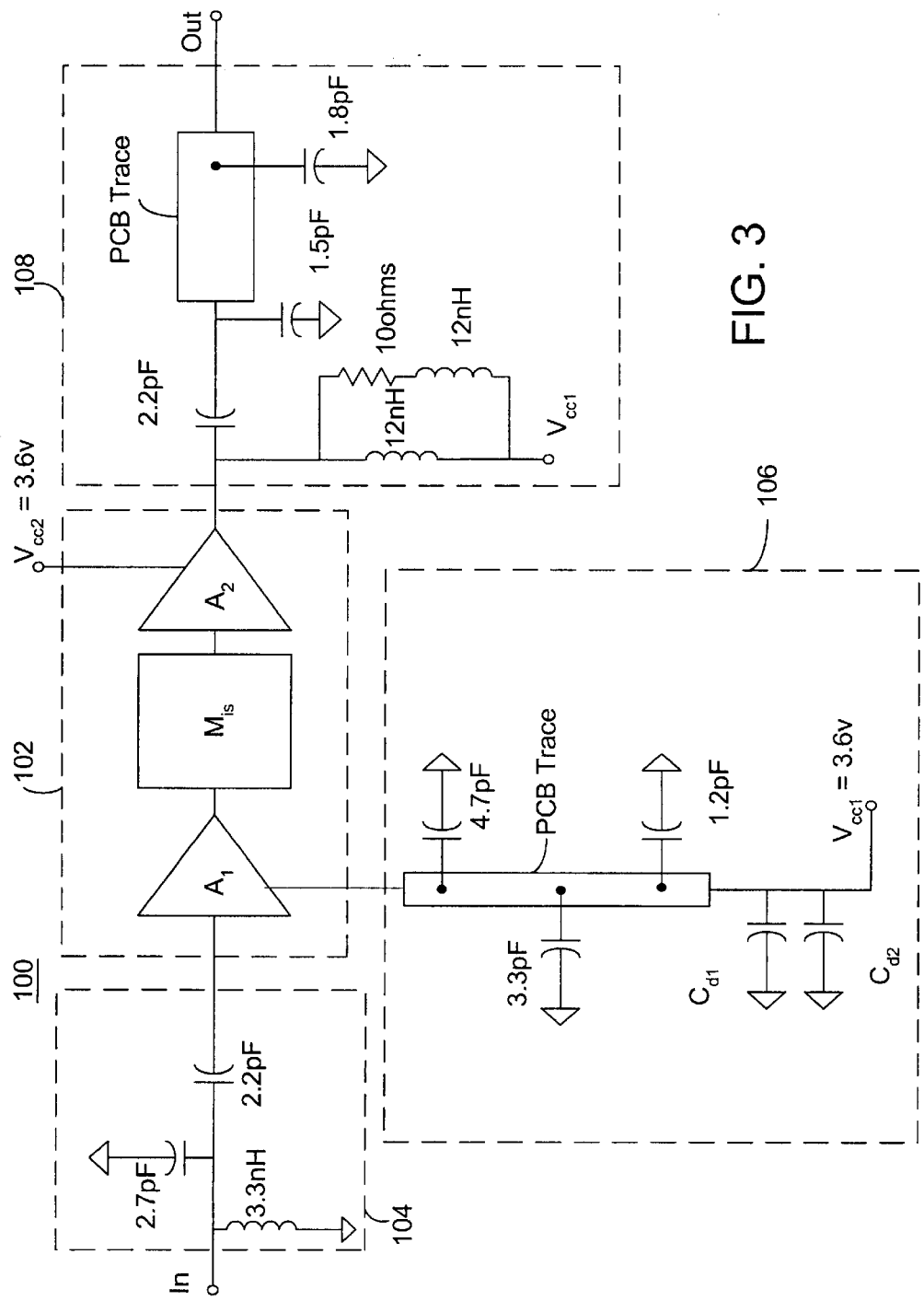
FIG. 3 is a schematic diagram of an exemplary multistage amplifier circuit in accordance with a preferred embodiment of the present invention.

FIG. 3 is a schematic diagram of a multistage amplifier circuit 100 in accordance with a preferred embodiment of the present invention. The amplifier circuit 100 includes an input matching network 104, an output matching network 108, and a multistage amplifier IC 102. A tuning circuit 106 is connected to the multistage amplifier 102. The IC 102 is implemented in a BiCMOS process with a peak $f_t$ of 30 GHz.

The input and output matching networks 104,108 and tuning circuit 106 are composed of discrete off-chip components. The input matching network 104 includes two capacitors and an inductor having values and connected together as shown. The output matching network 108 includes two inductors, three capacitors, a resistor, and a PCB trace connected in the topology shown in FIG. 3. The tuning circuit 106 includes three tuning capacitors having values as shown, connected to a PCB trace. A pair of de-coupling capacitors $C_{d1}$, $C_{d2}$ are also included in the tuning circuit 106.

Figure 4A:
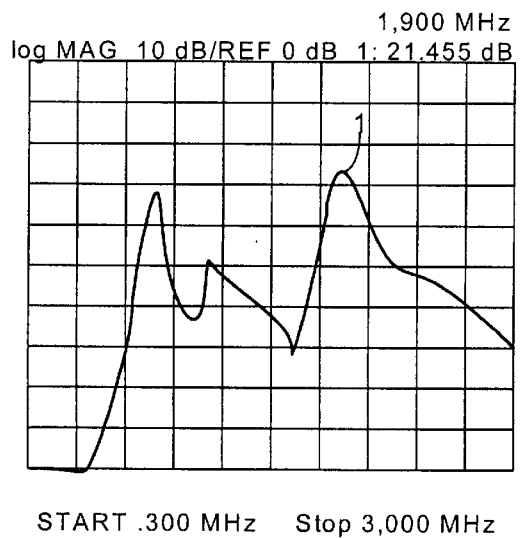
FIGS. 4A–C show exemplary traces of the performance of the multistage amplifier circuit shown in FIG. 3.
Figure 4B:
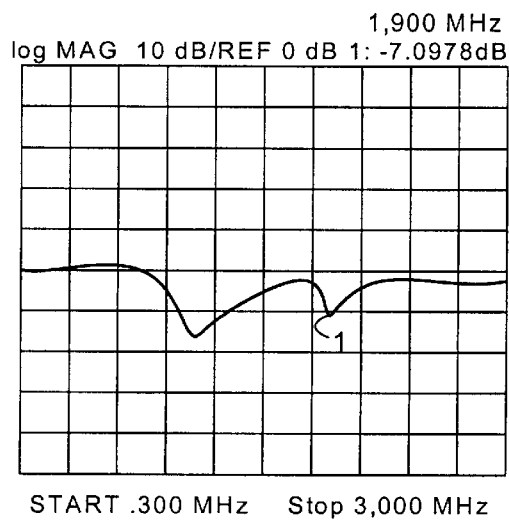
Figure 4C:
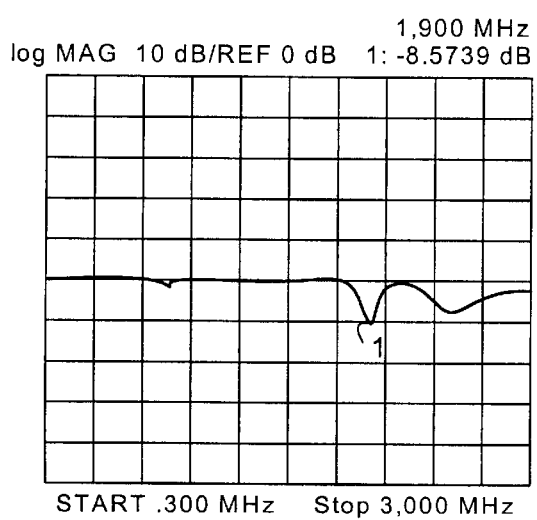

FIGS. 4A–C show small-signal measurements corresponding to the two-stage RF amplifier circuit 100, specifically designed for wireless applications at 1.9 GHz. In such applications, the circuit 100 can be used as a power amplifier in wireless handsets and portable devices. The measurements were made on the circuit 100, substituting an equivalent tuner circuit (not shown) for the desired frequency band around 1.9 GHz for the 1.5 pF, 1.8 pF, and PCB trace of the output matching network 108.

FIG. 4A is a gain curve for the circuit 100. The gain at 1.9 GHz (labeled '1' in the graph) is approximately 21.5 dB. This is a significant gain improvement over the same multistage RF amplifier circuit lacking the tuning circuit 106.

It is seen from FIG. 4A that the slope of the gain around the peak 1 at 1.9 GHz is quite steep. In other words, a useful bandwidth around 1.9 GHz is relatively narrow. This is because the high quality (Q) factor of the capacitors used. Resistors connected in series with the tuning capacitors, as shown in FIG. 2, can be used to reduce the Q and therefore increase the bandwidth.

FIG. 4B shows the input return loss for the circuit 100 of FIG. 3. At 1.9 GHz, the input return loss is approximately −7.1 dB.

FIG. 4C shows the output return loss for the circuit 100 of FIG. 3. At 1.9 GHz, the output return loss is approximately −8.6 dB.

While the embodiments of the present invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. A tuning circuit for an integrated multistage radio frequency (RF) amplifier having an inter-stage matching network and a voltage supply input, comprising:

a printed circuit board (PCB) trace for coupling a DC voltage source to the voltage supply input; and a first discrete capacitor and a second discrete capacitor, both connected in shunt between the PCB trace and ground, for tuning inductance on the voltage supply input to improve performance of the inter-stage matching network within the integrated multistage RF amplifier.

2. The tuning circuit of claim 1, further comprising:

a pull-up inductor connected between the voltage supply input and the PCB trace.

3. The tuning circuit of claim 1, further comprising:

a first resistor and a second resistor connected in series with the first and second capacitors, respectively.

4. The tuning circuit of claim 1, wherein the PCB trace has a predetermined width and length defining the impedance of the PCB trace.

5. The tuning circuit of claim 1, further comprising:
at least one de-coupling capacitor connected to the PCB trace.

6. An electronic circuit, comprising:
a first stage amplifier having a voltage supply input;
a second stage amplifier operatively coupled to the first stage amplifier;
an inter-stage matching network connected to the first and second stage amplifiers;
a capacitor connected between the voltage supply input and ground, the capacitor having a capacitance value selected for compensating inductance on the voltage supply input to improve performance of the inter-stage matching network; and
a printed circuit board (PCB) trace for coupling a DC voltage source to the voltage supply input, wherein the capacitor is connected to the PCB trace.

7. The electronic circuit of claim 6, further comprising:
a second capacitor connected between the voltage supply input and ground.

8. The electronic circuit of claim 6, further comprising:
an inductor connected between the voltage supply input and the capacitor.

9. The electronic circuit of claim 6, further comprising:
a resistor connected in series with the capacitor.

10. The electronic circuit of claim 6, further comprising:
at least one de-coupling capacitor operatively coupled to the voltage supply input.

11. The electronic circuit of claim 6, for radio frequency (RF) operation.

12. The electronic circuit of claim 6, wherein the capacitor is an open-circuit transmission line or a combination of an open-circuit transmission line and a discrete capacitor.

13. The electronic circuit of claim 6 wherein the first stage amplifier is a radio frequency (RF) amplifier.

14. The electronic circuit of claim 6 wherein the second stage amplifier is a radio frequency (RF) amplifier.

15. A method of tuning an inter-stage matching network included in a multistage amplifier having a voltage supply input, comprising:
providing an integrated circuit chip containing the multistage amplifier;
connecting the voltage supply input to a printed circuit board (PCB) trace for providing a DC supply voltage; and
connecting a discrete capacitor in shunt between the PCB trace and ground, wherein the discrete capacitor has a capacitance value selected to tune the inter-stage matching network of the multistage RF amplifier.

16. The method of claim 15, further comprising:
connecting a second discrete capacitor in shunt between the PCB trace and ground, wherein the second discrete capacitor has a capacitance value selected to tune the inter-stage matching network of the multistage RF amplifier.

17. The method of claim 15, further comprising:
providing a pull-up inductor connected between the voltage supply input and the PCB trace.

18. The method of claim 15, further comprising:
providing a resistor connected in series with the capacitor.

* * * * *